(12) United States Patent
Marui et al.

(10) Patent No.: US 8,114,726 B2
(45) Date of Patent: Feb. 14, 2012

(54) ALGAN/GAN HEMT WITH NORMALLY-OFF THRESHOLD MINIMIZED AND METHOD OF MANUFACTURING THE SAME

(75) Inventors: Toshiharu Marui, Gunma (JP); Hideyuki Okita, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 12/923,550

(22) Filed: Sep. 28, 2010

(65) Prior Publication Data

US 2011/0073912 A1    Mar. 31, 2011

(30) Foreign Application Priority Data

Sep. 29, 2009    (JP) .................................. 2009-224521

(51) Int. Cl.
*H01L 21/336* (2006.01)
(52) U.S. Cl. ........ 438/197; 438/162; 438/167; 438/172; 438/216; 438/478; 257/192; 257/194; 257/195; 257/200; 257/201; 257/E21.09
(58) Field of Classification Search .................. None
See application file for complete search history.

(56) References Cited

U.S. PATENT DOCUMENTS

2010/0072516 A1* 3/2010 Tamura et al. ................. 257/192

FOREIGN PATENT DOCUMENTS

JP    2007-227450 A    9/2007

OTHER PUBLICATIONS

Ken Nakata, Takeshi Kawasaki, Seiji Yaegashi, "Normally-off AlGaN/GaN HEMT with Recessed Gate for high Power Applications" Technical Report of the Institute of Electronics, Information and Communication Engineers (IEICE), ED2005-129, pp. 51-56, Oct. 2005.

Y.K. Kuo and W.W. Lin, "Band-Gap Bowing Parameter of the $Al_xGa_{1-x}N$ Derived from Theoretical Simulation", Jpn. J. Appl. Phys., vol. 41, 2002, pp. 73-74.

* cited by examiner

*Primary Examiner* — N Drew Richards
*Assistant Examiner* — Kyoung Lee
(74) *Attorney, Agent, or Firm* — Rabin & Berdo, P.C.

(57) ABSTRACT

In a method of forming a gate recess, on a surface of an epitaxial wafer including an epitaxial substrate, having a semiconductor layer having the band gap energy varying therein in the depth-wise direction, and a SiN surface protective layer, having a sidewall forming a gate opening and coating the surface of the epitaxial substrate, ultraviolet light having its energy equivalent to the band gap energy of the specific semiconductor layer is irradiated, while the specific semiconductor layer is photoelectrochemically etched from the gate opening with the SiN surface protective layer used as a mask. The gate recess free from plasma ion-induced damage is thus obtained.

6 Claims, 6 Drawing Sheets

ALGAN/GAN HEMT WITH NORMALLY-OFF THRESHOLD MINIMIZED AND METHOD OF MANUFACTURING THE SAME

BACKGROUND OF THE INVENTION

1. Field of the Invention

The present invention relates to a method of forming a gate recess of a semiconductor device, a method of manufacturing an AlGaN/GaN-HEMT (High-Electron Mobility Transistor), and an AlGaN/GaN-HEMT.

2. Description of the Background Art

A conventional structure and a method of manufacturing an AlGaN/GaN-HEMT, having a recessed-gate structure and normally-off characteristics (enhancement mode), are disclosed in Ken Nakata, et al., "Normally-off AlGaN/GaN HEMT with Recessed Gate for High Power Applications" Technical Report of the Institute of Electronics, Information and Communication Engineers (IEICE), pp. 51-56, ED2005-129, CPM2002-116, LQE005-56, Oct. 2005.

According to the solution, by dry etching such as inductively-coupled plasma reactive ion etching (ICP-RIE), an opening is formed in a SiN surface protective film at a position where a gate electrode is formed later, a gate recess is formed in a UID (Unintentionally Doped)-AlGaN electron supply layer, sometimes referred to as "UID-AlGaN layer", to a depth approximately 5 nm above a two-dimensional electron gas (2DEG) layer, by which the threshold voltage Vth is controlled, and a gate electrode is formed in the opening, to thereby manufacture a normally-off AlGaN/GaN-HEMT.

However, since the gate recess of the normally-off AlGaN/GaN-HEMT of the prior art is formed by dry etching, so that the gate recess may tend to vary in the depth, or may be damaged due to plasma ion, and thereby the threshold voltage (Vth), which is a critical electrical characteristic of the normally-off AlGaN/GaN-HEMT, may undesirably vary.

SUMMARY OF THE INVENTION

The present invention was conceived to solve the above-described problems, ant it is therefore an object of the invention to provide a method of forming a gate recess, a method of manufacturing a normally-off AlGaN/GaN-HEMT, and an AlGaN/GaN-HEMT, capable of minimizing variation in the threshold voltage (Vth).

According to the present invention, a method of forming a gate recess comprises irradiating ultraviolet (UV) light on a surface of an epitaxial wafer including an epitaxial substrate, having a semiconductor layer having its band gap energy varying therein in the depth-wise direction, and a SiN surface protective layer, having a sidewall forming a gate opening and coating a surface of the epitaxial substrate, the UV light having its energy substantially equivalent to the band gap energy of the semiconductor layer; and photoelectrochemically etching the specific semiconductor layer from the gate opening with the SiN surface protective layer used as a mask to thereby form a gate recess.

According to the method of the present invention, the gate recess is formed by photoelectrochemical etching which represents wet etching, while controlling the depth thereof based on the band gap energy of the semiconductor layer to be etched, rather than controlling etching time. Accordingly, the gate recess free from plasma ion-induced damage may be obtained, which would otherwise occur in dry etching.

According to one aspect of the present invention, a method of manufacturing an AlGaN/GaN-HEMT includes: a first step of preparing an epitaxial substrate having a buffer layer, a UID-GaN channel layer and a UID-AlGaN electron supply layer stacked in this order on a substrate, the UID-AlGaN electron supply layer being an epitaxial layer having an Al compositional ratio decreasing from the interface with the UID-GaN channel layer towards the surface of the epitaxial substrate; a second step of forming a SiN surface protective layer on a surface of the epitaxial substrate, the surface being on the side of the UID-AlGaN electron supply layer; a third step of forming a gate opening in the SiN surface protective layer to form an epitaxial wafer; a fourth step of irradiating ultraviolet (UV) light onto a surface of the epitaxial wafer, the UV light having an energy substantially equivalent to a band gap energy of a first portion of the UID-AlGaN electron supply layer, the first portion having a predetermined Al compositional ratio, while photoelectrochemically etching out a second portion of the UID-AlGaN electron supply layer, the second portion having an Al compositional ratio substantially smaller than the predetermined Al compositional ratio, through the gate opening with the SiN surface protective layer used as a mask to thereby form a gate recess; and a fifth step of infixing a gate electrode in the gate recess.

According to the method of manufacturing an AlGaN/GaN-HEMT based on the above-described first to fifth steps, the UID-AlGaN electron supply layer is an epitaxial layer having its Al compositional ratio which linearly decreases from the interface with the UID-GaN channel layer towards the surface. The present invention may therefore provide a method of manufacturing an AlGaN/GaN-HEMT, by which the depth of the gate recess may be set to a desired value, by appropriately selecting the energy of the UV light to be irradiated in the photoelectrochemical etching.

According to another aspect of the present invention, an AlGaN/GaN-HEMI includes: a substrate, a buffer layer stacked on the substrate, a UID-GaN channel layer stacked on the buffer layer, a UID-AlGaN electron supply layer stacked on the UID-GaN channel layer, a SiN surface protective layer formed on the UID-AlGaN electron supply layer, wherein the UID-AlGaN electron supply layer is an epitaxial layer having an Al compositional ratio decreasing from the interface with the UID-GaN channel layer towards the surface of the AlGaN/GaN-HEMT, the surface being on the side of the UID-AlGaN electron supply layer, the SiN surface protective layer includes a sidewall forming a gate opening, and the UID-AlGaN electron supply layer includes a sidewall forming a gate recess formed by photoelectrochemically etching out a portion of the UID-AlGaN electron supply layer having an Al compositional ratio substantially smaller than a predetermined Al compositional ratio through the gate opening with the SiN surface protective layer used as a mask, the AlGaN/GaN-HEMT further including a gate electrode joined with the gate recess.

In the thus-configured AlGaN/GaN-HEMT, since the UID-AlGaN electron supply layer is an epitaxial layer in which the Al compositional ratio linearly decreases from the interface with the UID-GaN channel layer towards the surface, an appropriate selection of the energy of UV light to be irradiated in the photoelectrochemical etching allows the depth of etching of the gate recess to be set to a desired value.

According to the present invention, a method of forming a gate recess, a method of manufacturing a normally-off AlGaN/GaN-HEMT, and an AlGaN/GaN-HEMT may be provided, which are capable of suppressing, or at least minimizing, variation in the threshold voltage (Vth).

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
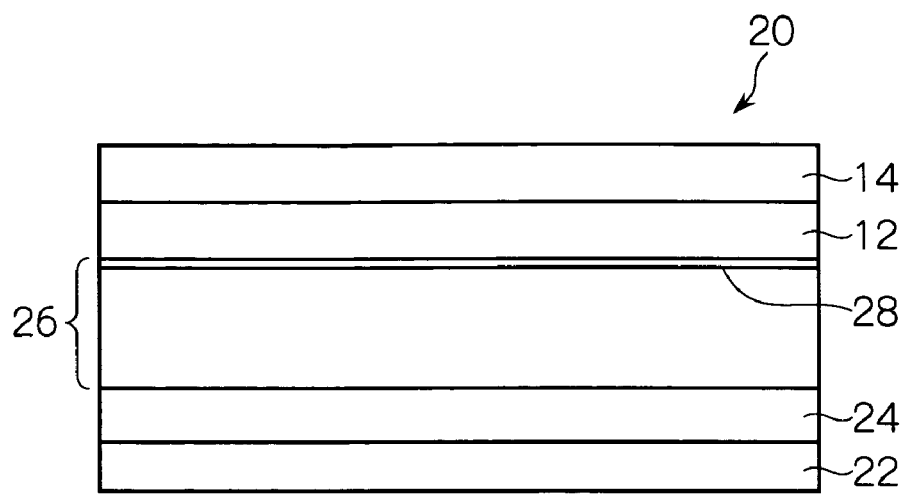
FIGS. 1-4 are schematic cross-sectional views showing the structure of, and sequential steps of a method of manufacturing, an AlGaN/GaN-HEMT according to a preferred embodiment of the present invention.

Now, a preferred embodiment of the present invention will be described in detail with reference to the accompanying drawings. Note that the individual figures are given merely so as to clarify specific features of the present invention, rather than exactly describing all dimensional relations of the individual constituents, and are therefore to be understood that the figures by no means limit the scope of the present invention. Like constituents in the figures are given the same reference numerals.

An illustrative embodiment of the present invention will be described referring to FIGS. 1-6. Firstly, an AlGaN/GaN-HEMT 10 according to the illustrative embodiment of the present invention will be described with reference to FIGS. 1-4.

As illustrated in FIGS. 1-4, in the AlGaN/GaN-HEMT 110 of the alternative embodiment, a UID-AlGaN electron supply layer has a double-layered structure configured by a UID-$Al_xGa_{1-x}N$ layer (x=0.375) 12, which is an AlGaN layer having a substantially larger Al compositional ratio, and a UID-$Al_yGa_{1-y}N$ layer (y=0.25) 14, which is another AlGaN layer having a substantially smaller Al compositional ratio. Furthermore, in the process of forming a gate recess 16, the depth of the gate recess 16 may be prevented from varying, by selectively etching only the UID-$Al_yGa_{1-y}N$ layer (y=0.25) 14 by photoelectrochemical etching. The configuration of the AlGaN/GaN-HEMT 10 of the alternative embodiment and a method of manufacturing the same will be described referring to those figures.

FIG. 1 is a cross-sectional view showing an epitaxial substrate 20 for use in fabricating the AlGaN/GaN-HEMT 10. The epitaxial substrate 20 is manufactured by epitaxial crystal growth based on a metal organic chemical vapor deposition (MOCVD) process at a temperature of 1000° C. or around.

A substrate 22 adopted herein may be, e.g. SiC single-crystal substrate, Si single-crystal substrate, sapphire single-crystal substrate or the like. On the substrate 22, a buffer layer 24 such as GaN or AlN layer is formed for the purpose of lattice relaxation. On the buffer layer 24, stacked in the order are a UID-GaN channel layer, sometimes referred to as "UID-GaN layer", 26, the UID-$Al_xGa_{1-x}N$ layer (x=0.375) 12 having a substantially larger Al compositional ratio in the double-layered configuration, and the UID-$Al_yGa_{1-y}N$ layer (y=0.25) 14 having a substantially smaller Al compositional ratio. In the UID-GaN layer 26, a 2DEG layer 28 is formed in the surficial region of the side contacting the UID-$Al_xGa_{1-x}N$ layer 12. The thickness of the UID-$Al_xGa_{1-x}N$ layer 12 is adjusted so that normally-off HEMT operation correspondent to the Al compositional ratio may be obtained.

Figure 2:
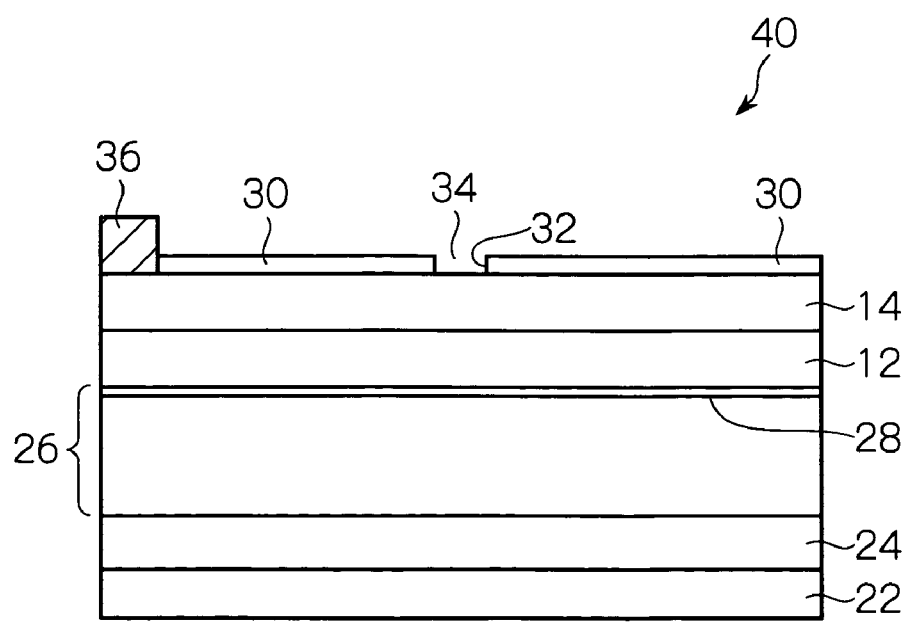
Figure 3:
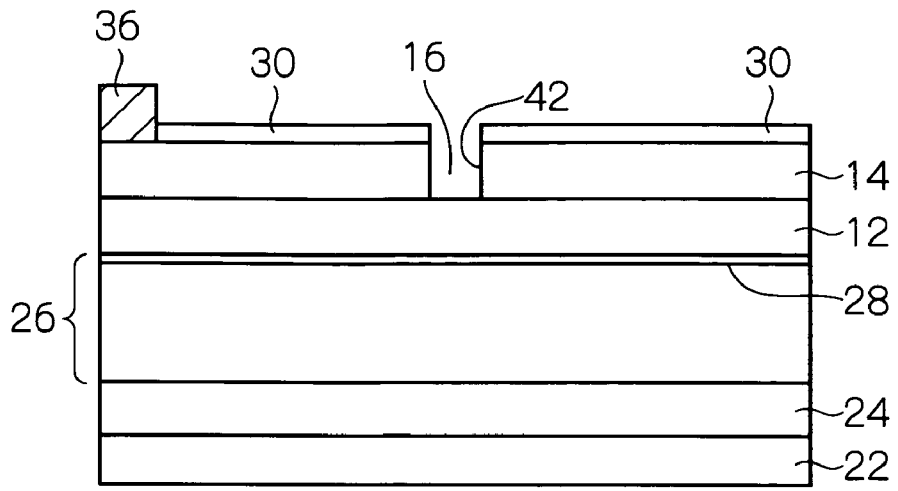

Next, as shown in FIG. 2, a SiN surface protective layer 30 is formed on the UID-$Al_yGa_{1-y}N$ layer (y=0.25) 14, by plasma-enhanced chemical vapor deposition (PE-CVD) process, and then etched by ICP-RIE to form a sidewall 32 forming a gate opening 34 and another sidewall forming an opening for mounting a current extraction electrode 36 for use in photoelectrochemical etching. Subsequently, the current extraction electrode 36 is mounted in the opening for the electrode. Thereby, an epitaxial wafer 40 is obtained.

The method of forming the SiN surface protective layer 30 may alternatively be thermal CVD or still other methods, in place of PE-CVD. The sidewall 32 forming the gate opening 34 may be formed by wet etching typically using hydrofluoric (HF) acid, or alternatively by dry etching.

Figure 5:
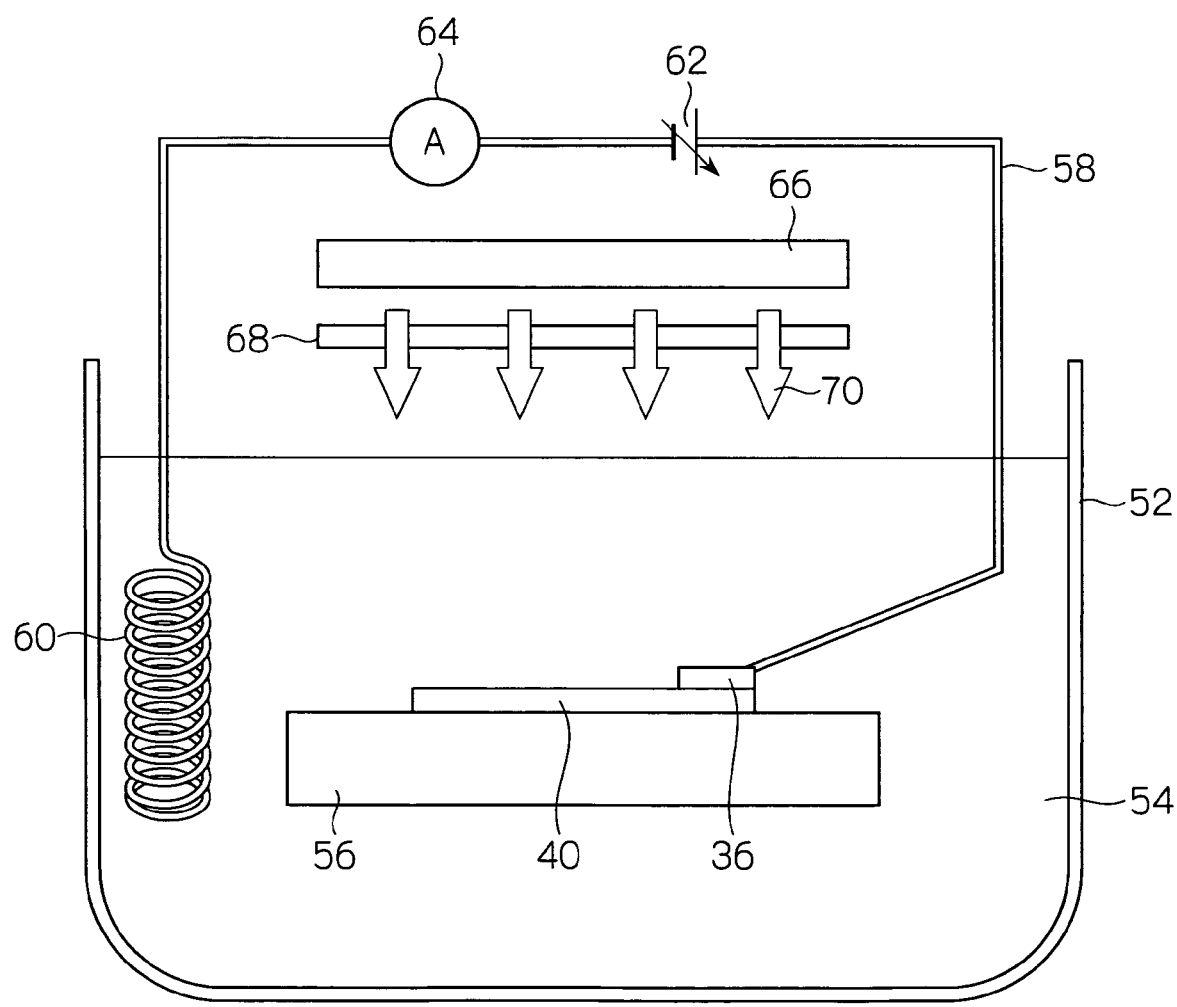
FIG. 5 schematically illustrates the configuration of a photoelectrochemical etching apparatus used in the illustrative embodiment shown in FIGS. 1-4.

Next, with reference to FIG. 5, typically by using a photoelectrochemical etching apparatus 50 set forth in Japanese Laid-Open Patent Publication No. 2007-227450, only the UID-$Al_yGa_{1-y}N$ layer (y=0.25) 14 is selectively etched in an aqueous or glycol solution containing alkali such as potassium hydroxide (KOH), sodium hydroxide (NaOH) or the like, or containing acid such as hydrochloric acid, while irradiating ultra-violet (UV) beam onto the surface of the epitaxial wafer 40, to thereby form a sidewall 42 forming the gate recess 16. Note that in the process of manufacturing compound semiconductor light-emitting device, the etching may be proceeded to an arbitrary depth.

The method of forming the gate recess 16 using the photoelectrochemical etching apparatus 50 will be briefed, referring to FIG. 5. FIG. 5 schematically depicts the configuration of the photoelectrochemical etching apparatus 50. An etching container 52 such as beaker is filled with etchant 54, that is, an aqueous or glycol solution containing alkali such as potassium hydroxide (KOH), sodium hydroxide (NaOH) or the like, or containing acid such as hydrochloric acid (HCl) dissolved therein. The container 52 is equipped with a jig 56 for holding the epitaxial wafer 40 in the container 52.

The epitaxial wafer 40 having the current extraction electrode 36 is fixed to the jig 56. A current extraction line 58 is connected to the current extraction electrode 36 provided to the epitaxial wafer 40. In the etching container 52, a cathode line 60 is included. Between the cathode line 408 and the current extraction line 58, a variable-voltage source 62 and an ammeter 64 are connected in series to each other. Material with high ionization tendency, such as platinum, gold, silver and carbon, may be used for the cathode line 60.

The photoelectrochemical etching apparatus 50 has a light source, such as a mercury lamp 66 with a filter 68. The mercury lamp 66 may ensure a substantially large area of irradiation, and is therefore capable of irradiating uniform UV light 70 onto the epitaxial wafer 40. The filter 68 selectively allows therethrough transmission of light to be irradiated onto the epitaxial wafer 40. A high-pressure mercury lamp or a low-pressure mercury lamp is preferably be adaptable as the mercury lamp 66.

Energy of the UV light to be irradiated via the filter onto the surface of the epitaxial wafer 40 in the photoelectrochemical etching is set to a value substantially smaller than the band gap energy of the UID-$Al_xGa_{1-x}N$ layer (x=0.375) 12, and substantially larger than the band gap energy of the UID-$Al_yGa_{1-y}N$ layer (y=0.25) 14.

The values of the band gap energy in relation to Al compositional ratio of AlGaN layer adopted herein were values calculated using CASTEP (Cambridge Serial Total Energy Package), refer to Y. K. Kuo, et al., "Band-Gap Bowing Parameter of the $Al_xGa_{1-x}N$ Derived from Theoretical Simulation" Jpn. J. Appl. Phys., vol. 41, 2002, pp. 73-74, for example.

In this illustrative embodiment, the UID-$Al_xGa_{1-x}N$ layer (x=0.375) 12 has a band gap energy of 4.499 eV which corresponds to a wavelength of 276 nm. The UID-$Al_yGa_{1-y}N$ layer (y=0.25) 14 has a band gap energy of 4.158 eV which corresponds to a wavelength of 298 nm.

Accordingly, only the UID-$Al_yGa_{1-y}N$ layer (y=0.25) 14 may be etched to produce the gate recess 16, by irradiating UV light having a wavelength of 275 nm to 298 nm onto the surface of the epitaxial wafer 40.

Figure 4:
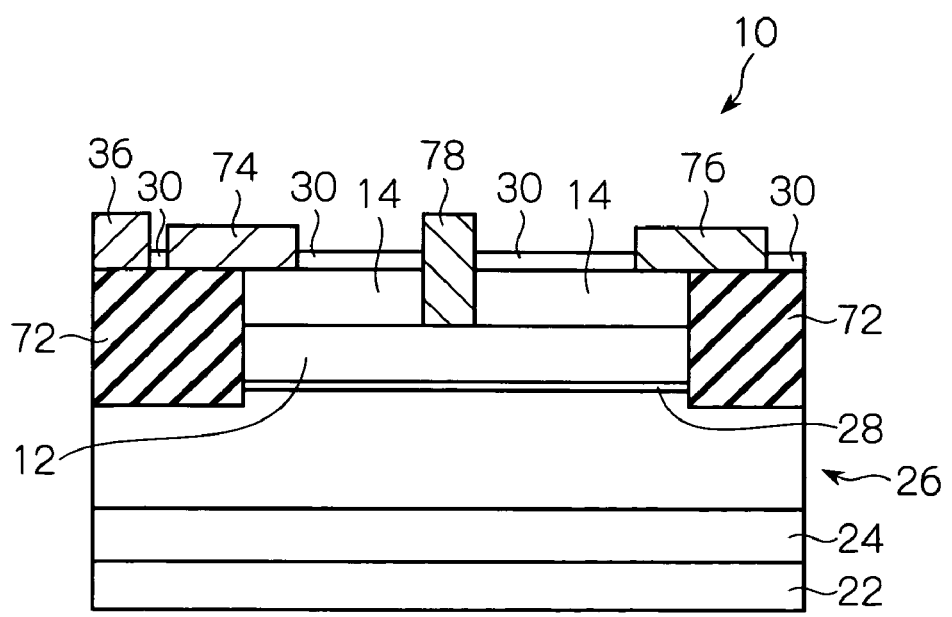

Then as shown in FIG. 4, for example, argon ion is introduced by ion implantation into the epitaxial wafer 40, to thereby form an isolation region 72 for isolating devices. Next, openings allowing therein formation of ohmic electrodes are formed in the SiN surface protective layer 30. The ohmic electrodes will be a source electrode 74 and a drain electrode 76. A gate electrode 78 is further joined in the opening of the gate recess 16. The normally-off AlGaN/GaN-HEMT 10 may be manufactured in this way.

While the gate structure of the instant illustrative embodiment has a Schottky junction, the gate may alternatively have a MIS (Metal-Insulator-Semiconductor) structure having a gate insulating film formed between the gate electrode 78 and the gate recess 16.

Figure 6:
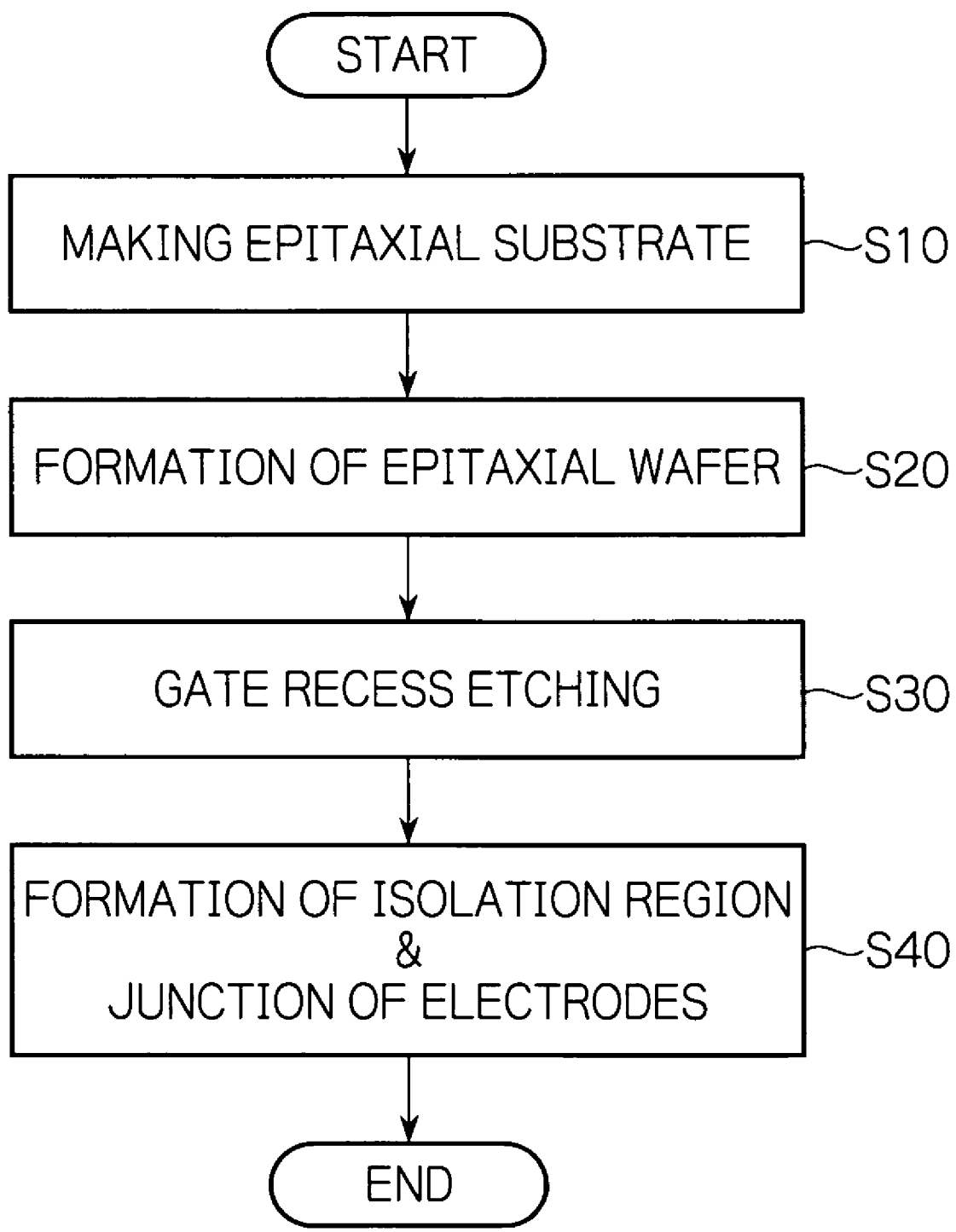
FIG. 6 is a schematic flow chart useful for understanding steps of manufacturing the AlGaN/GaN-HEMT according to the illustrative embodiment.

Principal steps of manufacturing the normally-off AlGaN/GaN-HEMT 10 of the instant embodiment represented in the above will be described referring to a flow chart in FIG. 6. The principal steps include a step of making the epitaxial substrate 20 having the double-layered UID-AlGaN layer 12 and 14 formed on the substrate 22 (step S10); a step of forming the SiN surface protective layer 30, and forming the gate opening 34 and joining the current extraction electrode 36 to thereby complete the epitaxial wafer 40 (step S20); a step of etching, in the gate opening 34, only the UID-AlGaN layer 14 on the surface side by photoelectrochemical etching so as to form the gate recess 16 (step S30); and a step of forming the isolation region 72 and then joining the ohmic electrodes 74 and 76 and the gate electrode 78 (step S40).

As has been described in the above, according to the normally-off AlGaN/GaN-HEMT 10 of the alternative embodiment, the depth of the gate recess may be determined by the thickness of the UID-AlGaN electron supply layer having a relatively smaller Al compositional ratio, by configuring the UID-AlGaN electron supply layer using two layers, and thereby the distance between the gate electrode and the 2DEG layer may be determined by the thickness of the UID-AlGaN electron supply layer having a relatively larger Al compositional ratio, so that the threshold voltage may be prevented from varying. In addition, the gate recess selectively formed by the photoelectrochemical etching, representing a wet process, may have a surface free from plasma ion-induced damage which would otherwise occur in dry etching.

Next, a normally-off AlGaN/GaN-HEMT 110 according to an alternative embodiment of the present invention will be described. The alternative embodiment may be the same as the previous embodiment shown in and described with reference to FIGS. 1-6 except that the double-layered, UID-AlGaN electron supply layer is replaced with an epitaxial layer having the Al compositional ratio which linearly decreases from the interface with the UID-GaN channel layer towards the surface, and that the gate recess is formed by etching, by the photoelectrochemical etching, a portion of the UID-AlGaN electron supply layer having the Al compositional ratio substantially smaller than a predetermined Al compositional ratio, through the gate opening formed in the SiN surface protective layer used as a mask, while irradiating UV light having an energy substantially equivalent to the band gap energy of the portion of the UID-AlGaN electron supply layer having the predetermined Al compositional ratio, onto the surface of the epitaxial wafer.

Accordingly, a repetitive description will be avoided on the elements and processes similar to those described with the previous embodiment. Like constituents having the same functions and operations may be given the same reference numerals.

Referring to FIGS. 7-10, the configuration and operation of the normally-off, AlGaN/GaN-HEMT 110 of this alternative embodiment will be described.

Figure 7:
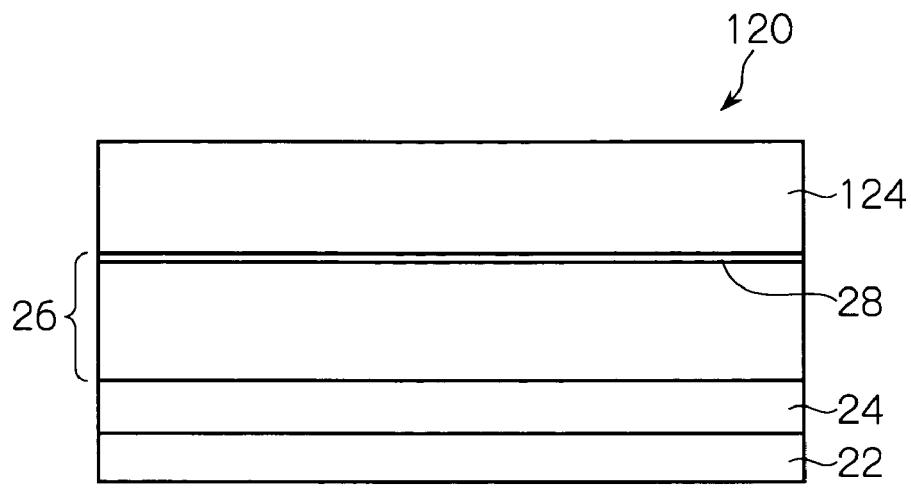
FIGS. 7-10 are schematic cross-sectional views, like FIGS. 1-4, showing the structure of, and a method of manufacturing, an AlGaN/GaN-HEMT according to an alternative embodiment of the present invention.

An epitaxial substrate 120 of the alternative embodiment, illustrated in FIG. 7, is similar to that of the previous embodiment shown in and described with reference to FIGS. 1-6, in terms of the configuration of the substrate 22, the buffer layer 24 and the UID-GaN layer 26. In the alternative embodiment, a UID-$Al_zGa_{1-z}$ layer 124 ($0.25 \leq z \leq 0.50$) is formed by crystal growth based on the MOCVD process, over the surface of the UID-GaN layer 26.

The UID-$Al_zGa_{1-z}$ layer 124 ($0.25 \leq z \leq 0.50$) is an epitaxial layer having the Al compositional ratio which linearly decreases from the interface with the UID-GaN layer 26 towards the surface. More specifically, the epitaxial substrate 120 is formed by allowing crystal growth of the UID-$Al_zGa_{1-z}$ layer 124 to proceed according to epitaxial growth conditions, under which the Al compositional ratio may linearly vary from 0.50 to 0.25.

Figure 8:
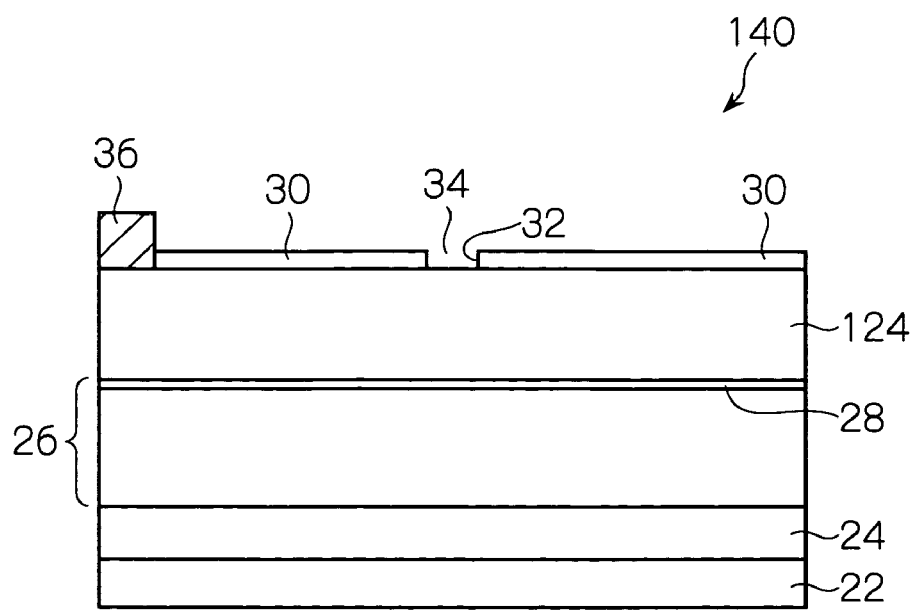

Next, as illustrated in FIG. 8, similarly to the foregoing embodiment, the SiN surface protective layer 30 is formed over the surface of the epitaxial substrate 120. The gate opening 34, which is shaped by a sidewall 32 formed in the SiN surface protective layer 30, and another opening for forming a current extraction electrode for use in photoelectrochemical etching are also formed in the SiN surface protective layer 30. The current extraction electrode 36 is then joined in the opening to thereby obtain an epitaxial wafer 140.

Figure 9:
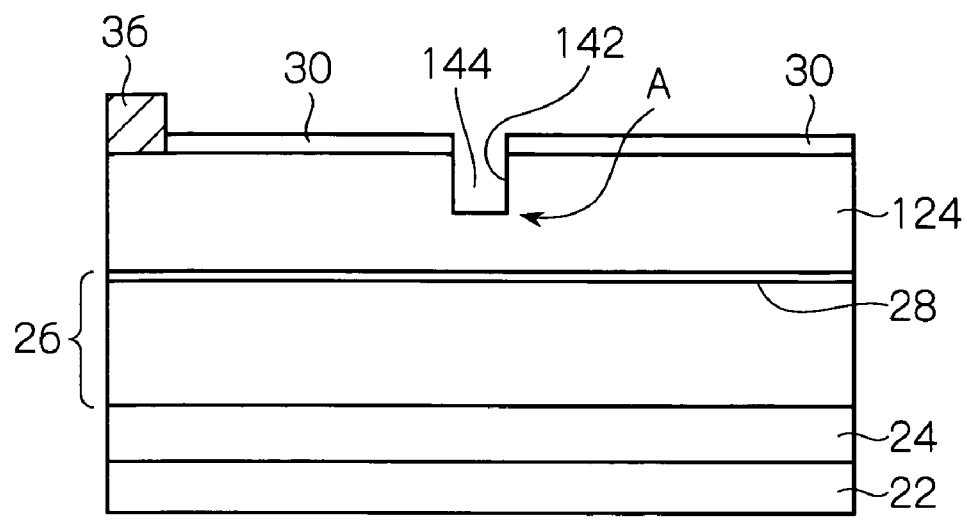

Next, as shown in FIG. 9, using the photoelectrochemical etching apparatus 50, the UID-$Al_zGa_{1-z}$ layer 124 is selectively etched to a desired depth, indicated with an arrow A, corresponding to the predetermined Al compositional ratio, in an aqueous or glycol solution containing alkali such as potassium hydroxide (KOH), sodium hydroxide (NaOH) or the like, or containing acid such as hydrochloric acid, while irradiating UV light onto the surface of the epitaxial wafer 140, to thereby form a sidewall 142 forming the gate recess 144.

The wavelength of the UV light irradiated onto the surface of the epitaxial wafer 140 in the process of photoelectrochemical etching may be determined corresponding to the band gap energy of the UID-$Al_zGa_{1-z}$ layer 124 at a desired depth of the gate recess.

For example, assuming now that the UID-$Al_zGa_{1-z}$ layer 124 in the alternative embodiment has an Al compositional ratio of 0.375 at a desired depth thereof, the arrow A, which is 5 nm above the 2DEG layer 28 towards the surface, the band gap energy corresponding thereto will be given 4.499 eV, and the wavelength corresponding to the band gap energy will be given 276 nm. Accordingly, by adjusting the wavelength of UV light to be irradiated onto the surface of the epitaxial wafer 250 to 276 nm, the UID-$Al_zGa_{1-z}$ layer 124 may selectively be etched to a depth 5 nm above the 2DEG layer 28 towards the surface, and thereby the gate recess 144 may be formed.

Figure 10:
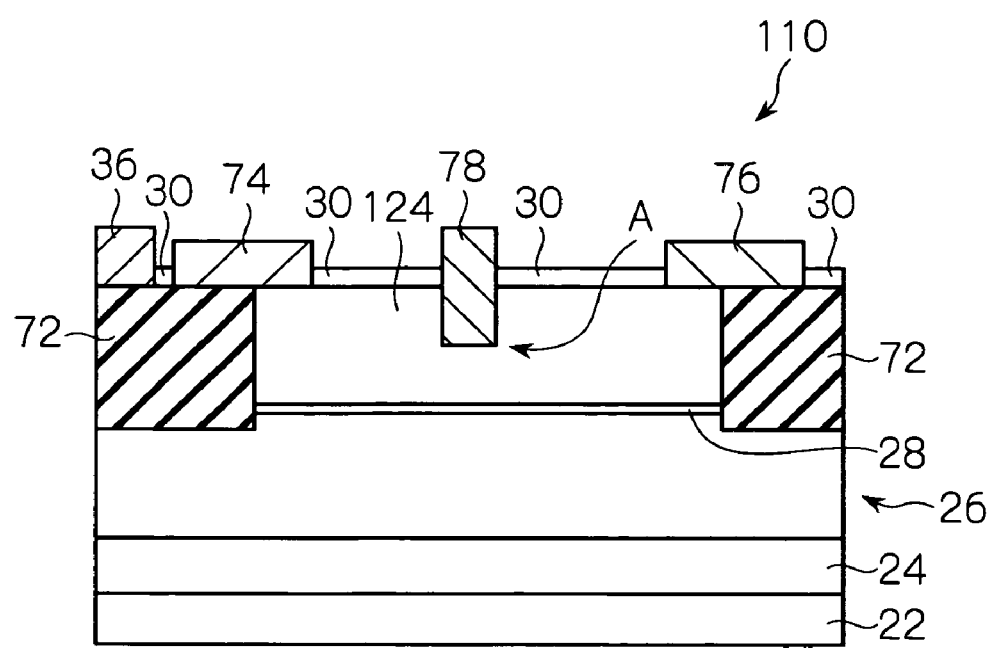

Then as illustrated in FIG. 10, and similarly to the foregoing embodiment described with reference to FIG. 4, the isolation region 72 for isolating devices is formed, and the openings allowing therein formation of the ohmic electrodes are formed in the SiN surface protective layer 30, the source electrode 74 and the drain electrode 76, which are the ohmic electrodes. The gate electrode 78 is also joined in the opening of the gate recess 144. The normally-off AlGaN/GaN-HEMT 110 may be manufactured in this way.

As has been described in the above, in the normally-off, AlGaN/GaN-HEMT 110 according to the alternative embodiment, the AlGaN layer may be prevented from being degraded in the surface morphology thereof, even if the Al compositional ratio of the UID-AlGaN electron supply layer is set larger than the Al compositional ratio adopted by ordinary AlGaN/GaN-HEMT. In addition, since the UID-AlGaN electron supply layer is an epitaxial layer having the Al compositional ratio linearly decreasing from the interface with the UID-GaN channel layer towards the surface, an appropriate selection of energy of the UV light to be irradiated in the photoelectrochemical etching may render the depth of etching of the gate recess set to a desirable value.

While the condition regarding the depth of the gate recess described in the foregoing embodiments was described on the premise of enabling the normally-off operation, the alternative embodiment is also be adaptable to an ordinary normally-on AlGaN/GaN-HEMT having a substantially smaller depth of the gate recess.

The configuration of the above-described embodiments is also be adaptable to other types of HEMT composed of other compound semiconductor such as GaAs and so forth.

The entire disclosure of Japanese patent application No. 2009-224521 filed on Sep. 29, 2009, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A method of forming a gate recess, comprising:
   irradiating ultraviolet (UV) light on a surface of an epitaxial wafer comprising an epitaxial substrate, having a semiconductor layer having a band gap energy varying therein in a depth-wise direction, and a SiN surface protective layer, having a sidewall forming a gate opening and coating a surface of the epitaxial substrate, the UV light having an energy substantially equivalent to the band gap energy of the semiconductor layer; and
   photoelectrochemically etching the semiconductor layer from the gate opening with the SiN surface protective layer used as a mask to thereby form a gate recess.

2. A method of manufacturing an AlGaN/GaN high-electron mobility transistor (AlGaN/GaN-HEMT), comprising:
   a first step of preparing an epitaxial substrate having a buffer layer, an unintentionally doped-GaN (UID-GaN) channel layer and a UID-AlGaN electron supply layer stacked in this order on a substrate, the UID-AlGaN electron supply layer being an epitaxial layer having an Al compositional ratio decreasing from an interface with the UID-GaN channel layer towards a surface of the epitaxial substrate;
   a second step of forming a SiN surface protective layer on a surface of the epitaxial substrate, the surface of the epitaxial substrate being on a side of the UID-AlGaN electron supply layer;
   a third step of forming a gate opening in the SiN surface protective layer to form an epitaxial wafer;
   a fourth step of irradiating ultraviolet (UV) light onto a surface of said epitaxial wafer, the UV light having an energy substantially equivalent to a band gap energy of a first portion of the UID-AlGaN electron supply layer, the first portion having a predetermined Al compositional ratio, while photoelectrochemically etching out a second portion of the UID-AlGaN electron supply layer, the second portion having an Al compositional ratio substantially smaller than the predetermined Al compositional ratio, through the gate opening with the SiN surface protective layer used as a mask to thereby form a gate recess; and
   a fifth step of infixing a gate electrode in the gate recess.

3. The method in accordance with claim 2, wherein in said fourth step, the predetermined Al compositional ratio, the band gap energy, and the wavelength of the UV light to be irradiated are 0.375, 4.499 eV and 276 nm, respectively.

4. The method in accordance with claim 2, wherein
   the UID-AlGaN electron supply layer comprises a first UID-AlGaN electron supply layer having a first Al compositional ratio, and a second UID-AlGaN electron supply layer stacked on the first UID-AlGaN electron supply layer, the second UID-AlGaN electron supply layer having a second Al compositional ratio substantially smaller than the first Al compositional ratio, and
   in said fourth step, the UV light to be irradiated onto the epitaxial wafer has an energy substantially smaller than the band gap energy of the first UID-AlGaN electron supply layer and substantially larger than the band gap energy of the second UID-AlGaN electron supply layer, whereby only the second UID-AlGaN electron supply layer is etched.

5. An AlGaN/GaN high-electron mobility transistor (AlGaN/GaN-HEMT) comprising:
   a substrate;
   a buffer layer stacked on said substrate;
   a UID-GaN channel layer stacked on said buffer layer;
   a UID-AlGaN electron supply layer stacked on said UID-GaN channel layer;
   a SiN surface protective layer formed on said UID-AlGaN electron supply layer, wherein
   said UID-AlGaN electron supply layer is an epitaxial layer having an Al compositional ratio decreasing from an interface with said UID-GaN channel layer towards a surface of said AlGaN/GaN-HEMT, the surface being on a side of said UID-AlGaN electron supply layer,
   said SiN surface protective layer comprises a sidewall forming a gate opening, and
   said UID-AlGaN electron supply layer comprises a sidewall forming a gate recess formed by photoelectrochemically etching out a portion of said UID-AlGaN electron supply layer having an Al compositional ratio substantially smaller than a predetermined Al compositional ratio through the gate opening with said SiN surface protective layer used as a mask,
   said AlGaN/GaN-HEMT further comprising a gate electrode joined with said gate recess.

6. The AlGaN/GaN-HEMT in accordance with claim 5, wherein
   said UID-AlGaN electron supply layer comprises a first UID-AlGaN electron supply layer having a first Al compositional ratio, and a second UID-AlGaN electron supply layer stacked on said first UID-AlGaN, said second UID-AlGaN electron supply layer having an Al compositional ratio substantially smaller than the first Al compositional ratio, and said gate recess is formed by etching only said second UID-AlGaN electron supply layer.

* * * * *